United States Patent
Hsieh et al.

(10) Patent No.: US 12,224,034 B2
(45) Date of Patent: Feb. 11, 2025

(54) MEMORY DEVICE AND DATA APPROXIMATION SEARCH METHOD THEREOF

(71) Applicant: MACRONIX International Co., Ltd., Hsinchu (TW)

(72) Inventors: Chih-Chang Hsieh, Hsinchu (TW); Hang-Ting Lue, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 161 days.

(21) Appl. No.: 18/311,800

(22) Filed: May 3, 2023

(65) Prior Publication Data

US 2023/0368821 A1 Nov. 16, 2023

Related U.S. Application Data (63) Continuation-in-part of application No. 17/742,148, filed on May 11, 2022, now Pat. No. 12,073,883.

(Continued)

(51) Int. Cl.
*G11C 7/08* (2006.01)
*G06F 7/501* (2006.01)
(Continued)

(52) U.S. Cl.
CPC ............... *G11C 7/08* (2013.01); *G06F 7/501* (2013.01); *G11C 7/1096* (2013.01); *G11C 7/12* (2013.01)

(58) Field of Classification Search
CPC .............................. G11C 15/00; G11C 15/046
(Continued)

(56) References Cited

U.S. PATENT DOCUMENTS 7,355,890 B1  4/2008  Wen
8,169,808 B2  5/2012  Roohparvar
(Continued)

FOREIGN PATENT DOCUMENTS

CN  106158021  11/2016
JP  H0973793  3/1997
(Continued)

OTHER PUBLICATIONS

"Office Action of Taiwan Counterpart Application", issued on Oct. 31, 2023, p. 1-p. 7.

(Continued)

*Primary Examiner* — Anthan Tran
(74) *Attorney, Agent, or Firm* — J.C. PATENTS (57) ABSTRACT

A memory device and a data approximation search method thereof are proposed. The memory device includes a plurality of selection switch pairs, a plurality of memory cell string pairs, a sense amplifier, and a page buffer. The selection switch pairs receive multiple search data pairs, respectively. The memory cell string pairs are respectively coupled to a global bit line through the selection switch pairs. Each of the memory cell string pairs determines whether to provide current on the global bit line according to stored data of a selected memory cell pair and each of the search data pairs. The sense amplifier obtains multiple search results according to the current on the global bit line and at least one reference currents respectively corresponding to at least one similarity. The page buffer records the search results and generates similarity information by accumulating the search results.

17 Claims, 6 Drawing Sheets

Related U.S. Application Data (60) Provisional application No. 63/439,599, filed on Jan. 18, 2023.

(51) Int. Cl.
  *G11C 7/10* (2006.01)
  *G11C 7/12* (2006.01)

(58) Field of Classification Search
  USPC .................................................. 365/189.011
  See application file for complete search history.

(56) References Cited

U.S. PATENT DOCUMENTS

| | | | |
|---|---|---|---|
| 2009/0190404 A1* | 7/2009 | Roohparvar | G11C 16/0483 365/49.17 |
| 2016/0172037 A1* | 6/2016 | Lee | G11C 16/26 365/185.12 |
| 2018/0197592 A1 | 7/2018 | Katayama et al. | |
| 2019/0221262 A1 | 7/2019 | Ma et al. | |
| 2020/0219547 A1 | 7/2020 | Ma et al. | |
| 2021/0050060 A1 | 2/2021 | Li et al. | |
| 2021/0090645 A1 | 3/2021 | Inaba et al. | |

FOREIGN PATENT DOCUMENTS

| | | |
|---|---|---|
| JP | 2002260388 | 9/2002 |
| JP | 2015185196 | 10/2015 |
| JP | 2023044545 | 3/2023 |
| TW | 201935301 | 9/2019 |
| TW | 202030737 | 8/2020 |
| TW | I703578 | 9/2020 |
| TW | 202122993 | 6/2021 |
| TW | 202131325 | 8/2021 |
| TW | 202137704 | 10/2021 |
| WO | 2021199386 | 10/2021 |

OTHER PUBLICATIONS

"Notice of Allowance of Japan Counterpart Application," issued on Apr. 25, 2024, p. 1-p. 3, in which the listed reference was/references were cited.

"Office Action of Taiwan Counterpart Application", issued on Jan. 8, 2024, pp. 1-6.

"Office Action of Korea Counterpart Application", issued on Sep. 19, 2024, p. 1-p. 5.

"Office Action of Taiwan Counterpart Application", issued on Jul. 30, 2024, pp. 1-7.

* cited by examiner

MEMORY DEVICE AND DATA APPROXIMATION SEARCH METHOD THEREOF

CROSS-REFERENCE TO RELATED APPLICATION

This application is a continuation-in-part application of and claims the priority benefit of U.S. application Ser. No. 17/742,148, filed on May 11, 2022. This application also claims the priority benefit of U.S. provisional application Ser. No. 63/439,599, filed on Jan. 18, 2023. The entirety of each of the above-mentioned patent applications is hereby incorporated by reference herein and made a part of this specification.

BACKGROUND

Technical Field

The disclosure relates to a memory device and a data approximation search method thereof, and more particularly to a memory device capable of performing big data searches and a data approximation search method thereof.

Description of Related Art

With the advancement of electronic technology, the development of artificial intelligence has achieved rapid progress in recent years. In order to improve the efficiency of big data analysis, an in-memory searcher that provides big data search is proposed. In today's technology, how to efficiently generate similarity information for big data search has become an important topic in this field.

SUMMARY

The disclosure provides a memory device and a data approximation search method thereof, which may be applied to the approximation search of a large amount of data to effectively obtain similarity information of the data search.

The memory device of the disclosure includes multiple selection switch pairs, multiple memory cell string pairs, a sense amplifier, and a page buffer. The selection switch pairs receive multiple search data pairs, respectively. The memory cell string pairs are respectively coupled to a global bit line through the selection switch pairs. Each of the memory cell string pairs determines whether to provide current on the global bit line according to stored data of a selected memory cell pair and each of the search data pairs. The sense amplifier is coupled to the global bit line and obtains one of multiple search results according to the current on the global bit line and at least one reference current respectively corresponding to at least one similarity. The page buffer records the search results and generates similarity information by accumulating the search results generated time-divisionally.

The approximation search method for data of the disclosure is described below. Multiple search data pairs are received by multiple selection switch pairs, respectively. Multiple memory cell string pairs are coupled to a global bit line through the selection switch pairs, respectively. Each of the memory cell string pairs determines whether to provide current on the global bit line according to stored data of a selected memory cell pair and each of the search data pairs. One of multiple search results are obtained according to the current on the global bit line and at least one reference current respectively corresponding to at least one similarity. The search results are recorded and similarity information is generated by accumulating the search results.

Based on the above, by receiving the search data pairs by the selection switch pairs, respectively, the memory device of the disclosure enables the stored data of the selected memory cell pair in the memory cell string pairs corresponding to the selection switch pair to execute data searching operation in analog type corresponding to the search data pairs. The memory device of the disclosure records multiple search results obtained time-divisionally according to the current on the global bit line and counts the search results to generate similarity information in the data searching operation and complete a comparing operation on big data.

DESCRIPTION OF THE EMBODIMENTS

Figure 1:
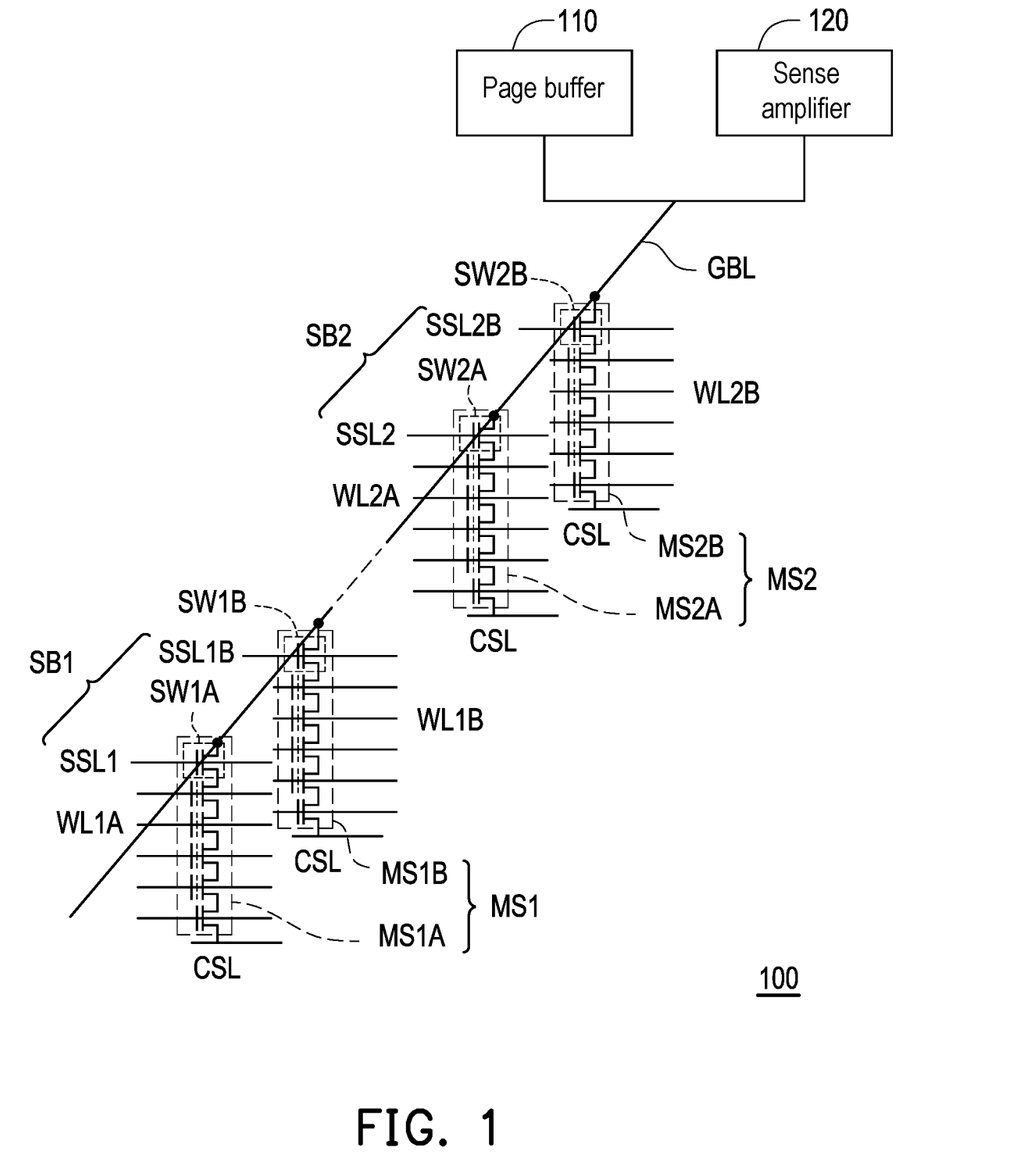
FIG. 1 is a schematic view of a memory device according to an embodiment of the disclosure.

FIG. 1 is a schematic view of a memory device according to an embodiment of the disclosure Referring to FIG. 1, a memory device 100 includes multiple memory cell string pairs MS1 to MS2, multiple selection switch pairs formed by multiple selection switches SW1A, SW1B, SW2A, and SW2B, a sense amplifier 120, and a page buffer 110. The memory cell string pair MS1 includes memory cell strings MS1A and MS1B. The memory cell strings MS1A and MS1B have selection switches SW1A and SW1B, respectively. The memory cell strings MS1A and MS1B are respectively coupled to the global bit line GBL through the selection switches SW1A and SW1B. The memory cell string pair MS2 includes memory cell strings MS2A and MS2B. The memory cell strings MS2A and MS2B have selection switches SW2A and SW2B, respectively. The memory cell strings MS2A and MS2B are respectively coupled to the global bit line GBL through the selection switches SW2A and SW2B. The memory cell strings MS1A, MS1B, MS2A, and MS2B are coupled to a common source line CSL.

During the data searching operation, search data SB1 and SB2 with multiple bits may search in the memory device 100 time-divisionally or synchronizedly. Corresponding to the search data SB1, a pair of search data SSL1 and SSL1B may be generated and provided to the control ends of the selection switches SW1A and SW1B, respectively. The search data SSL1 may have the same logic value as the search data SB1, and the search data SSL1B may have a complementary logic value to the search data SSL1. In addition, corresponding to the search data SB2, a pair of search data SSL2 and SSL2B may be generated and provided to the control ends of the selection switches SW2A and SW2B, respectively. The search data SSL2 may have the same logic value as the search data SB2, and the search data SSL2B may have a complementary logic value to the search data SSL2.

During the data searching operation, in each of the memory cell strings MS1A, MS1B, MS2A, and MS2B, a read voltage may be received, for example, by using word lines WL1A, WL1B, WL2A, WL2B. In addition, in memory cell strings MS1A, MS1B, MS2A, and MS2B, memory cells respectively corresponding to the word lines WL1A, WL1B, WL2A, and WL2B are selected memory cells.

Taking memory cell strings MS1A and MS1B as examples, corresponding to the search data SB1 with a logic value of 1, in response to the search data SSL1 with a logic value of 1 and the search data SSL1B with a logic value of 0, if the selected memory cell in the memory cell string MS1A records a high logic level (H), and the selected memory cell in the memory cell string MS1B records a low logic level (L), the search result is a match, and the memory cell strings MS1A and MS1B do not generate current on the global bit line GBL. Corresponding to the search data SB1 with a logic value of 1, if the selected memory cell in the memory cell string MS1A records a low logic level (L), and the selected memory cell in the memory cell string MS1B records a high logic level (H), the search result is not a match, and the memory cell string MS1A may generate current on the global bit line GBL.

On the other hand, corresponding to the search data SB1 with a logic value of 0, in response to the search data SSL1 with a logic value of 0 and the search data SSL1B with a logic value of 1, if the selected memory cell in the memory cell string MS1A records a high logic level (H), and the selected memory cell in the memory cell string MS1B records a low logic level (L), the search result is not a match, and the memory cell string MS1B may generate current on the global bit line GBL. Corresponding to the search data SB1 with a logic value of 0, if the selected memory cell in the memory cell string MS1A records a low logic level (L), and the selected memory cell in the memory cell string MS1B records a high logic level (H), the search result is a match, and the memory cell strings MS1A and MS1B do not generate current on the global bit line GBL.

To further illustrate, during data searching operation, the sense amplifier 120 is used to measure a magnitude of the current on the global bit line GBL to obtain a similarity between the search data and data stored in the selected memory cell. The sense amplifier 120 may obtain a search result of the data searching operation by comparing the current on the global bit line GBL with one or more reference currents. In this embodiment, the memory device 100 may make multiple memory cell string pairs formed by memory cell strings MS1A, MS1B, MS2A, and MS2B perform a data searching operation to the search data with multiple bits time-divisionally or synchronizedly within a time interval. The sense amplifier 120 may correspondingly obtain multiple search results time-divisionally. The search results generated by the sense amplifier 120 may be transmitted to the page buffer 110. The page buffer 110 may record the search results. Further, the page buffer 110 may generate similarity information by counting the obtained search results.

It should be noted, the sense amplifier 120 may set one or more reference currents corresponding to one or more similarities with different degrees, respectively, and obtains a data search result corresponding to one of the similarities by comparing the current on the global bit line GBL with the reference currents. Specifically, the sense amplifier 120 is configured to sense a magnitude of the current on the global bit line GBL to generate the data search result. That is, the sense amplifier 120 executes a sensing operation in analog type.

For example, in response to the sense amplifier 120 determining that the current of the global bit line GBL is smaller than a reference threshold corresponding to a similarity, the sense amplifier 120 may determine that the data searching result is a match and generate a search result such as a logic value of 0. The page buffer 110 may records a value of the similarity according to the data searching result of the sense amplifier 120. The page buffer 110 may further obtain the similarity information between the search data and the data stored in the memory device 100 in the searching operation by accumulating multiple data searching results generated by the sense amplifier 120 within a certain time interval. In this embodiment, the smaller the value of the similarity information accumulated by the page buffer 110 is, the higher the similarity between the search data and the data stored in the memory device 100 is. In contrast, the greater the value of the similarity information accumulated by the page buffer 110 is, the lower the similarity between the search data and the data stored in the memory device 100 is.

In other embodiments of the disclosure, the page buffer 110 may also accumulate inverted search results generated by the sense amplifier 120. In this case, the greater the value of the similarity information accumulated by the page buffer 110 is, the higher the similarity between the search data and the data stored in the memory device 100 is. In contrast, the smaller the value of the similarity information accumulated by the page buffer 110 is, the lower the similarity between the search data and the data stored in the memory device 100 is.

In the embodiment of present invention, by sharing the sense amplifiers and the page buffer 110 with a plurality of memory cell strings MS1 to MS2, a dimension of the data search operation can be improved. Take number of the memory cell strings is 128 as example, by executing search operation on the 128 memory cell strings 16 times, the search operation with 128×16 (=2048) bits can be complete. Correspondingly, the page buffer 110 may set resisters with 4 bits to record the similarity information generated correspondingly. It is worth mentioned, by increasing the registers with one bit, the bit numbers of the similarity information recorded by the page buffer 110 may be doubled.

Figure 2A:
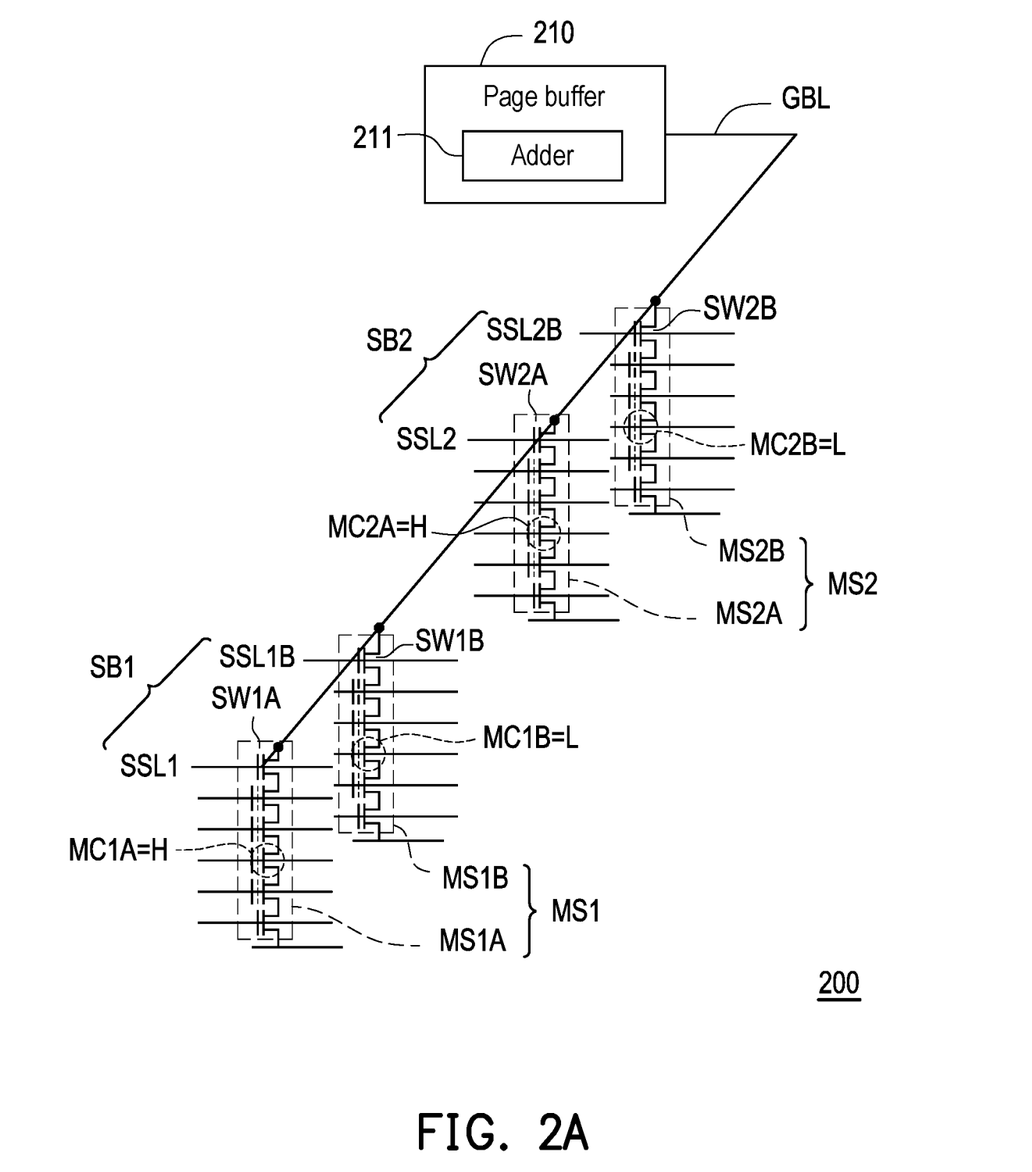
FIG. 2A and FIG. 2B are schematic views of a memory device according to another embodiment of the disclosure.
Figure 2B:
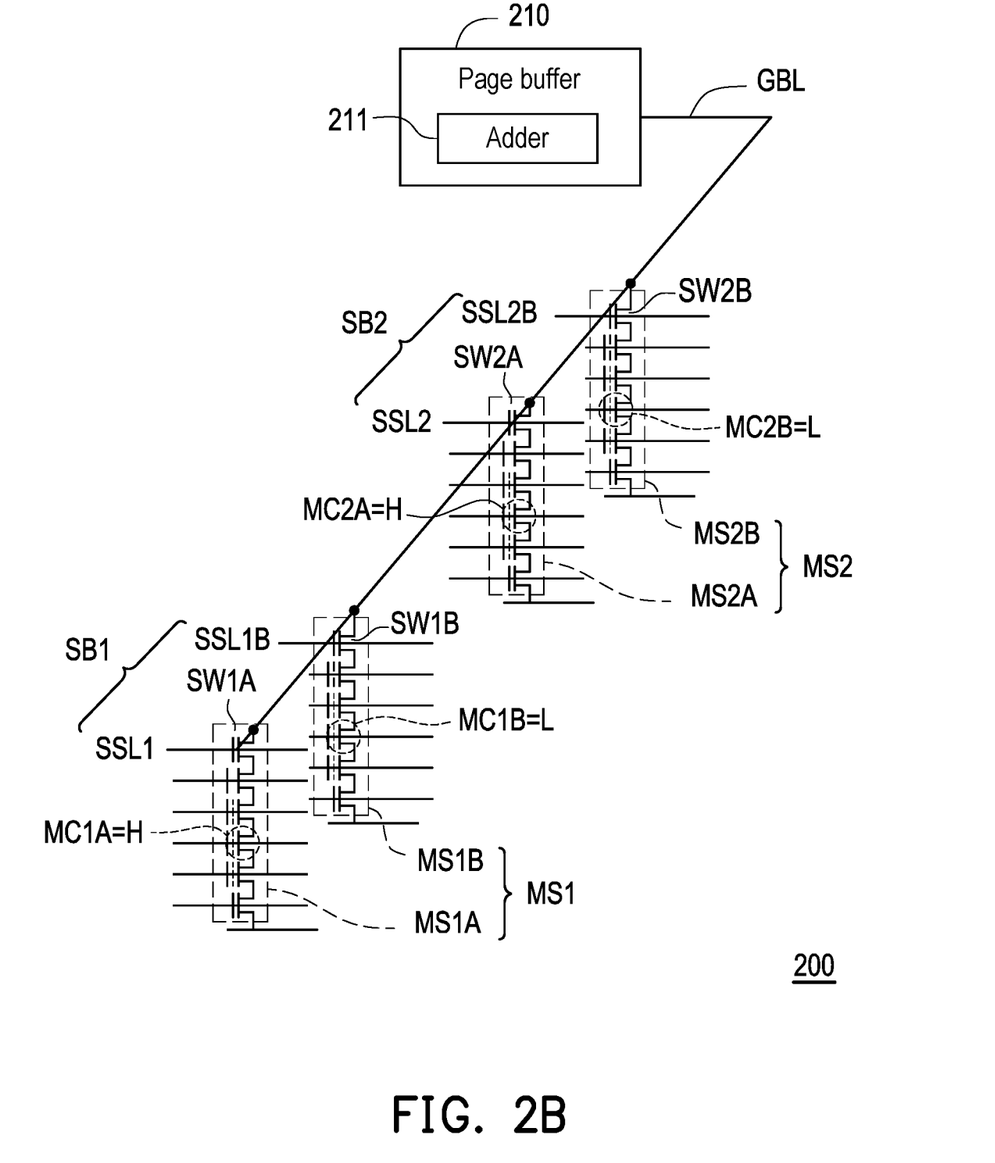

FIG. 2A and FIG. 2B are schematic views of a memory device according to another embodiment of the disclosure, referring to FIG. 2A and FIG. 2B, a memory device 200 includes multiple memory cell string pairs MS1 to MS2, multiple selection switch pairs formed by multiple selection switches SW1A, SW1B, SW2A, and SW2B, and a page buffer 210. The memory cell string pair MS1 includes memory cell strings MS1A and MA1B, and the memory cell string pair MS2 includes memory cell strings MS2A and MA2B. The memory cell string MS1A, MA1B, MS2A, and MA2B are respectively coupled to the global bit line GBL through the selection switches SW1A, SW1B, SW2A, and SW2B. The selection switches SW1A and SW1B form a selection switch pair and receive a pair of search data SSL1 and SSL1B, respectively. The selection switches SW2A and SW2B form another selection switch pair and receive a pair of search data SSL2 and SSL2B, respectively.

In this embodiment, the memory cell strings MS1A and MA1B may first perform the data searching operation and search for the data stored in selected memory cells MC1A and MC1B based on the search data SB1. Based on the search data SB1 having a logic value of 1, the search data SSL1 may have a logic value of 1, and the search data SSL1B may have a logic value of 0. Taking the selected memory cells MC1A and MC1B storing high logic level (H) and low logic level (L) respectively as examples, the data searching operation of the memory cell strings MS1A and MA1B is a match, and the memory cell strings MS1A and MA1B do not generate current on the global bit line GBL.

Correspondingly, the search result with a logic value of 0 may be recorded in a first register in the page buffer 210. In this embodiment, the page buffer 210 may have a second register and a third register. The second register may record an initial value (e.g., equal to a logic value of 1), and the page buffer 210 may generate a logic value recorded in the third register based on a logic operation. For example, the page buffer 210 may invert the logic value in the first register, and perform an AND operation with the logic value in the second register to generate the logic value recorded in the third register. In the case that the search result matches, the first register records a logic value of 0, and the page buffer 210 may calculate that the logic value recorded in the third register is a logic value of 1.

On the other hand, the page buffer 210 includes an adder 211. The adder 211 may accumulate the logic values recorded in the third register in each searching operation, thereby generating similarity information. In response to the logic value recorded in the third register being the logic value of 1, the adder 211 may increase the similarity information by 1.

In FIG. 2B, the memory cell strings MS2A and MA2B may execute the next data searching operation and search for the data stored in selected memory cells MC2A and MC2B based on the search data SB2.

Based on the search data SB2 having a logic value of 0, the search data SSL2 may have a logic value of 0, and the search data SSL2B may have a logic value of 1. Taking the selected memory cells MC2A and MC2B storing high logic level (H) and low logic level (L) respectively as examples, the data searching operation of the memory cell strings MS2A and MA2B is not a match, and the memory cell string MS2B generates current on the global bit line GBL.

Correspondingly, the search result with a logic value of 1 may be recorded in the first register in the page buffer 210. In this embodiment, the second register may record the value recorded in the first register previously (equal to the logic value of 1), and the page buffer 210 may generate a logic value recorded in the third register based on the logic operation. For example, the page buffer 210 may invert the logic value in the first register, and perform an AND operation with the logic value in the second register to generate the logic value recorded in the third register. In the case that the search result matches, the first register records a logic value of 1, and the page buffer 210 may calculate that the logic value recorded in the third register is a logic value of 0.

In this embodiment, after the logic value recorded in the third register is recorded as a logic value of 0, the logic value recorded in the second register is set to a logic value of 0. Thus, in subsequent searching operations, the logic value recorded in the third register is always equal to the logic value of 0. Thus, in this embodiment, the logic value recorded in the third register may be a logic value of 1 only when all the search results match.

On the other hand, the adder 211 may continuously accumulate the logic values recorded in the third register in multiple searching operations, thereby generating the similarity information. In this embodiment, the greater the value of the similarity information calculated by the adder 211 is, the higher the similarity between the search data and the stored data in multiple data searching operations. In contrast, the lower the value of the similarity information calculated by the adder 211 is, the lower the similarity between the search data and the stored data in multiple data searching operations.

In other embodiments of the disclosure, the adder 211 may also accumulate inverted logic values recorded in the third register. Under such a circumstance, the lower the value of the similarity information calculated by the adder 211 is, the higher the similarity between the search data and the stored data in multiple data searching operations; the greater the value of the similarity information calculated by the adder 211 is, the lower the similarity between the search data and the stored data in multiple data searching operations.

In other embodiments of the disclosure, the adder 211 may not perform the accumulation for the logic values recorded in the third register. In contrast, the adder 211 may perform accumulation for the logic values recorded in the first register, or the inverted logic values recorded in the first register. After multiple accumulations, the adder 211 may record the generated multiple bits of addition result in multiple registers, thereby obtaining the similarity information. For example, four registers may be disposed in the page buffer 210, and the adder 211 may generate similarity information ranging from 0 to 15.

Figure 3A:
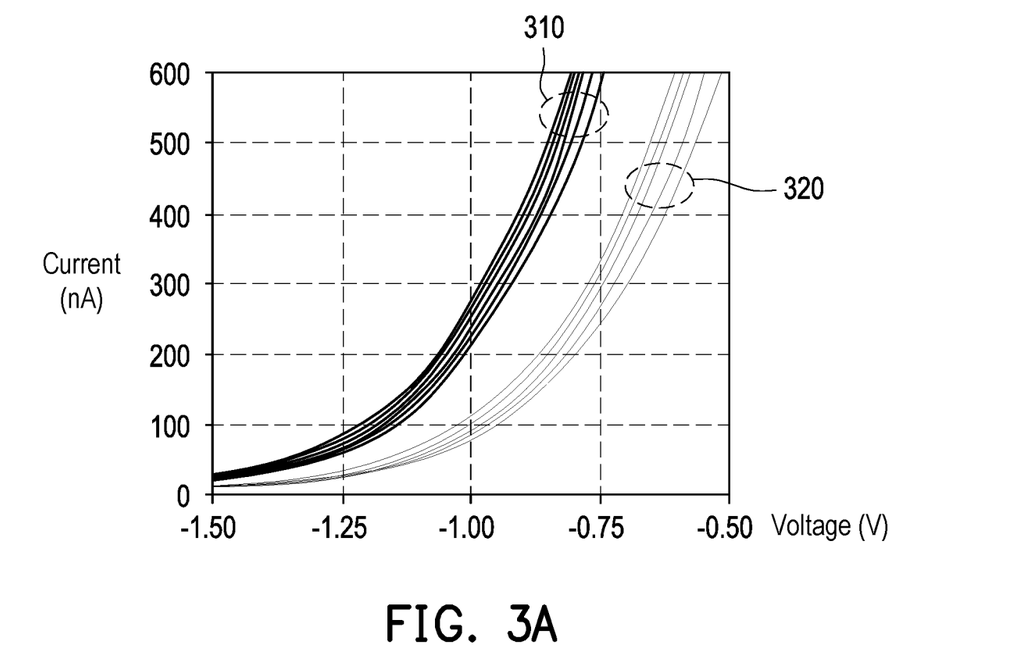
FIG. 3A shows a relationship between currents on a global bit line and word line voltages generated by a memory cell string under different similarity information and with a large amount of memory cell strings.
Figure 3B:
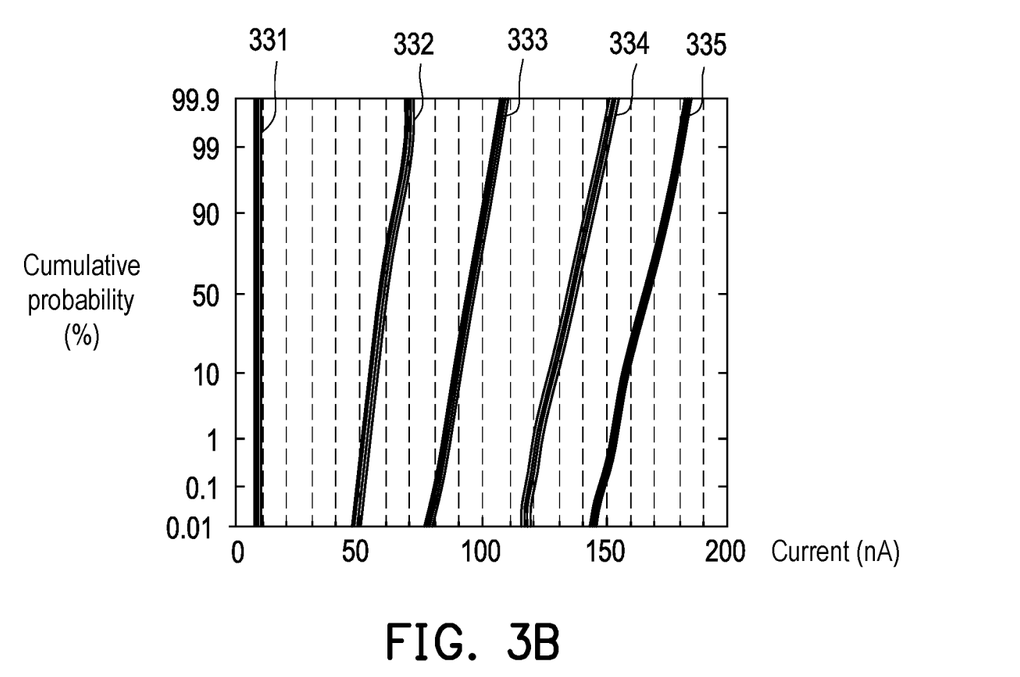
FIG. 3B is a schematic view of currents on a global bit line corresponding to different Hamming distance.

Please refer to FIG. 3A and FIG. 3B. FIG. 3A shows a relationship between currents on a global bit line and word line voltages generated by a memory cell string under different similarity information and with a large amount of memory cell strings. FIG. 3B is a schematic view of currents on a global bit line corresponding to different Hamming distance. The Hamming distance is the amount information of difference bits calculated by performing exclusive OR operation on the search data and the data stored in the memory cell. For example, in response to the search data being 10011011 in binary and the data stored in the memory cell being 01111001 in binary, the Hamming distance may be the sum of the exclusive OR operation between 10011011 and 01111001, which is, for example, equal to 4.

In FIG. 3A, assuming that there are 128 memory cell strings on the global bit line, the normalized Hamming distance may be directly proportional to the current on the global bit line.

Corresponding to a position where the word line voltage is approximately equal to-1 volt, a distribution curve 310 has a 50% Hamming distance correspondingly, which may generate a current of about 170 nanoamperes on the global bit line; a distribution curve 320 has a 25% Hamming distance correspondingly, which may generate a current of about 95 nanoamperes on the global bit line.

The vertical axis of FIG. 3B is the cumulative probability, and the horizontal axis is the currents on the global bit line. Curves 331 to 335 are schematic views of the current relationship on the global bit line that respectively correspond to different Hamming distances. The curves 331 to 335 correspond to the normalized Hamming distance of 0%, 12.5%, 25%, 37.5%, and 50%, respectively. In present embodiment, according to current distribution ranges corresponding to curves 331 to 335, the memory device may set one or more reference currents corresponding to one or more similarities, respectively. Wherein, the similarities respectively correspond the Hamming distances in the figure. Take the curves 331 and 332 as an example, by setting the reference current to 30 nA, whether the normalized Hamming distance of the data search result larger than 0% can be determined.

It may be clearly seen from FIG. 3A and FIG. 3B that under the condition of a sufficiently large amount of memory cell strings, the similarity of the search result of the data searching may be clearly judged by judging the current interval on the global bit line.

Figure 4:
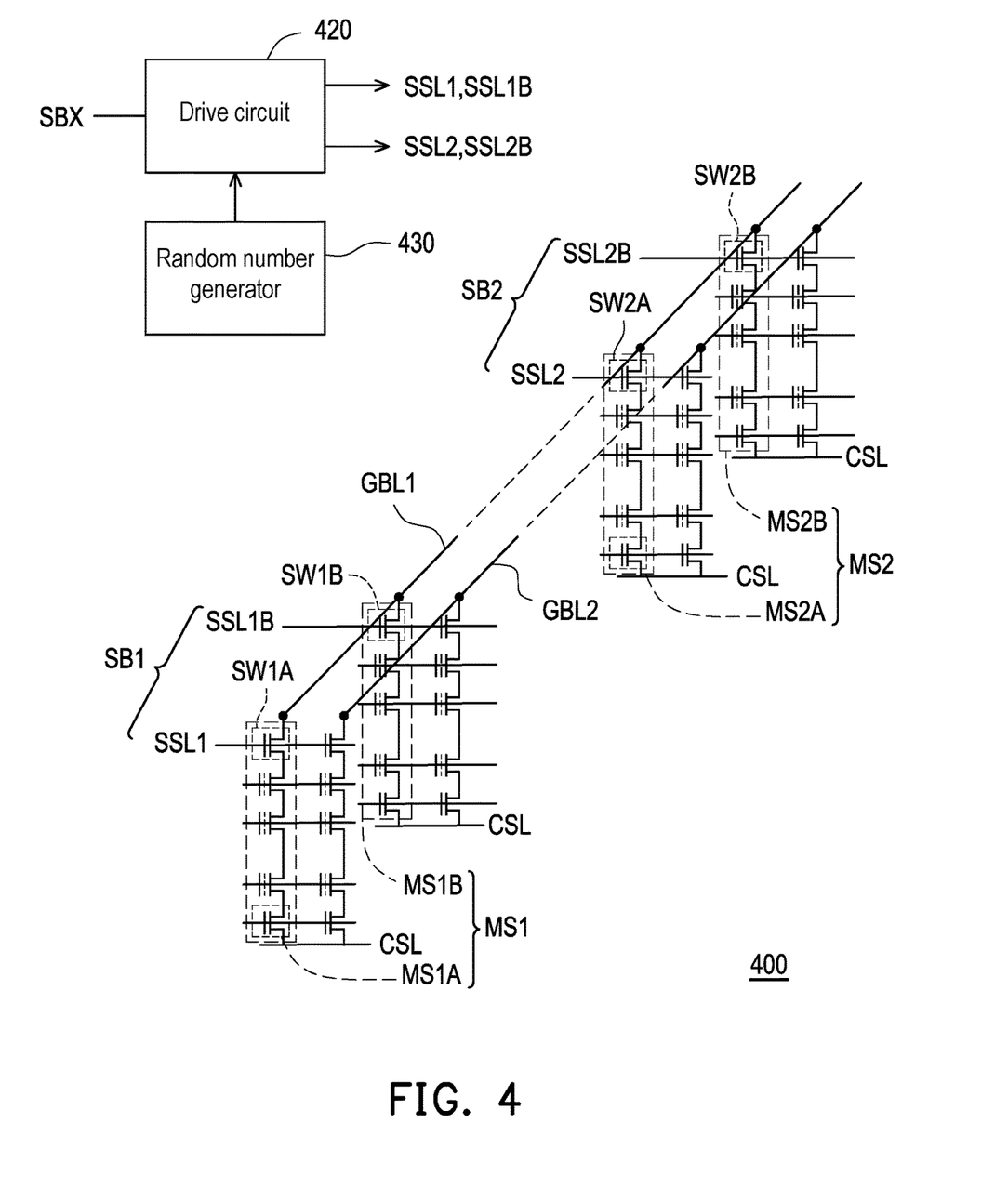
FIG. 4 is a schematic view of a memory device according to another embodiment of the disclosure.

FIG. 4 is a schematic view of a memory device according to another embodiment of the disclosure, referring to FIG. 4, the memory device 400 includes multiple memory cell string pairs MS1 and MS2, multiple selection switches SW1A, SW1B, SW2A, and SW2B, a drive circuit 420, and a random number generator 430. The memory cell string pair MS1 includes the memory cell strings MS1A and MS1B, and the memory cell string pair MS2 includes the memory cell strings MS2A and MS2B. The memory cell strings MS1A and MS1B are respectively coupled to a global bit line GBL1 through the selection switches SW1A and SW1B, and the memory cell strings MS2A and MS2B are respectively coupled to the global bit line GBL1 through the selection switches SW2A and SW2B. In this embodiment, the memory device 400 may have the rest of a global bit line GBL2, and the global bit line GBL2 may also be coupled to multiple memory cell strings with the same structure as the memory cell strings MS1A, MS1B, MS2A, and MS2B. The memory cell strings MS1A, MS1B, MS2A, and MS2B on the global bit line GBL1 may correspond to the memory cell strings on the global bit line GBL2, respectively, and are connected in parallel. The memory cell strings may share the same common source line CSL.

The drive circuit 420 is coupled to the selection switches SW1A, SW1B, SW2A, and SW2B and configured to generate the search data SSL1, SSL1B, SSL2, and SSL2B according to source data SBx. The source data SBx includes the search data SB1 and SB2. In addition, the random number generator 430 is coupled to the drive circuit 420 for setting at least one of the search data pairs generated by the drive circuit 420 to be a wild card signal.

It is worth mentioning that in response to the search data pair being a wild card signal, the search data SSL1 and SSL1B generated by the drive circuit 420 may both have a logic value of 0. That is, in response to the search data pair being a wild card signal, the search result of the corresponding memory cell strings (e.g., memory cell strings MS1A and MS1B) has to be a match, and current is not provided on the corresponding global bit line GBL1.

Figure 5:
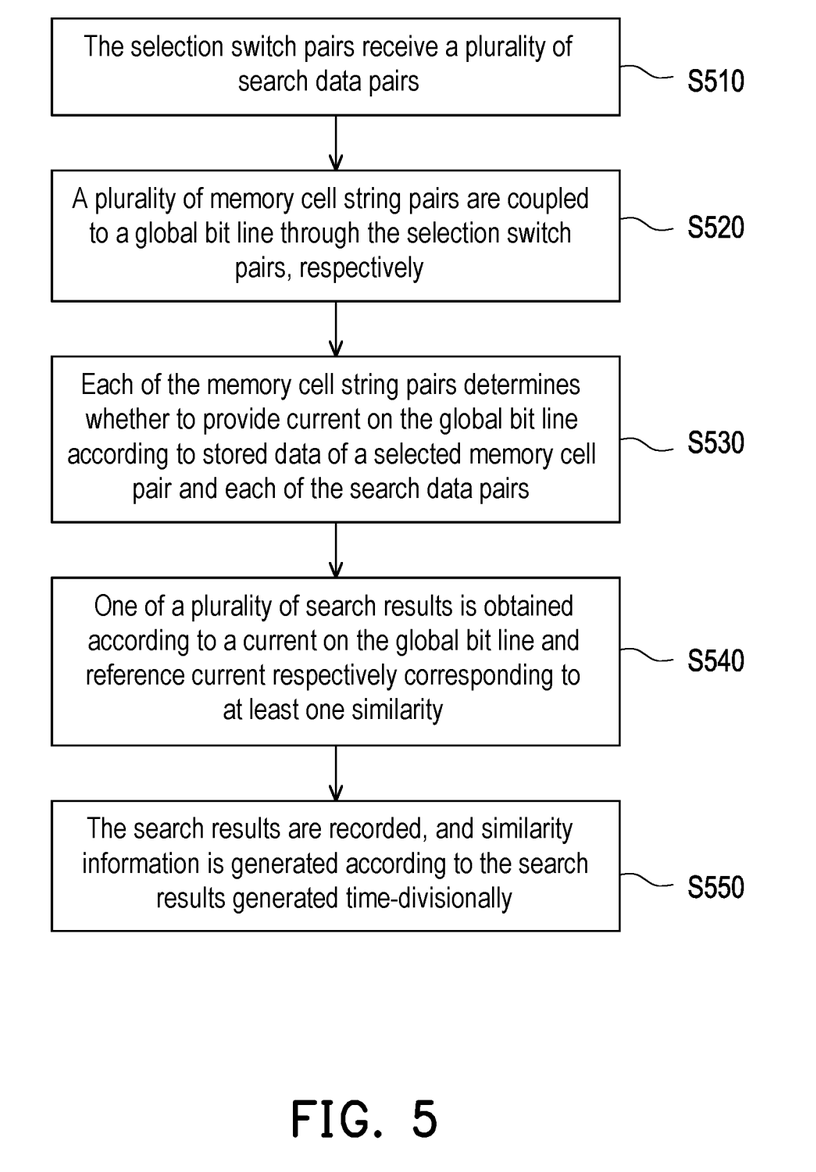
FIG. 5 is a flowchart of a data approximation search method according to an embodiment of the disclosure.

Please refer to FIG. 5. FIG. 5 is a flowchart of a data approximation search method according to an embodiment of the disclosure. In step S510, the selection switch pairs receive multiple search data pairs, respectively. In step S520, multiple memory cell string pairs are coupled to a global bit line through the selection switch pairs, respectively. In step S530, each of the memory cell string pairs determines whether to provide current on the global bit line according to stored data of a selected memory cell pair and each of the search data pairs. In step S540, multiple search results are obtained time-divisionally according to the current on the global bit line. In addition, in step S550, the search results are recorded and similarity information is generated by accumulating the search results.

The implementation details of the above steps have been described in detail in the aforementioned embodiments, and will not be repeated here.

To sum up, the memory device of the disclosure provides multiple memory cell string pairs, and receives multiple search data pairs through the selection switch pairs, so as to perform data searching operation between the search data pairs and the stored data of the selected memory cell pair. The page buffer of the disclosure may record the search results generated by multiple data searching operations and generate similarity information by accumulating the search results generated time-divisionally.

What is claimed is:

1. A memory device, comprising:
   a plurality of selection switch pairs, respectively receiving a plurality of search data pairs;
   a plurality of memory cell string pairs, respectively coupled to a global bit line through the selection switch pairs, wherein each of the memory cell string pairs determines whether to provide current on the global bit line according to stored data of a selected memory cell pair and each of the search data pairs;
   a sense amplifier, coupled to the global bit line, obtaining one of a plurality of search results according to the current on the global bit line and at least one reference current respectively corresponding to at least one similarity; and
   a page buffer, recording the search results and generating similarity information by accumulating the search results generated time-divisionally.

2. The memory device according to claim 1, wherein in response to each of the search data pairs matching each of the stored data of each of the memory cell string pairs, the memory cell string pairs do not generate current on the global bit line.

3. The memory device according to claim 1, wherein in response to each of the search data pairs not matching at least one of the stored data of each of the memory cell string pairs, the memory cell strings generate current on the global bit line.

4. The memory device according to claim 1, wherein in response to each of the search data pairs matching each of the stored data of each of the memory cell string pairs, a first register of the page buffer records a first logic value; wherein in response to each of the search data pairs not matching at least one of the stored data of each of the memory cell string pairs, the first register of the page buffer records a second logic value, wherein the first logic value is complementary to the second logic value.

5. The memory device according to claim 4, wherein the page buffer sets a second register to record the second logic value, performs logic operation on logic values recorded in the first register and the second register, and records an operation result in a third register.

6. The memory device according to claim 5, wherein the page buffer comprises an adder, and the adder is used to perform a cumulative operation on logic values recorded in the third register in a time interval, or perform the cumulative operation on inverted logic values recorded in the third register to generate an addition result, and generate the similarity information according to the addition result.

7. The memory device according to claim 4, wherein the page buffer comprises an adder, and the adder is used to perform a cumulative operation on logic values recorded in the first register in a time interval, or perform the cumulative operation on inverted logic values recorded in the first register to generate an addition result, and generate the similarity information according to the addition result.

8. The memory device according to claim 1, further comprising:
   a random number generator, setting at least one of the search data pairs to be a wild card signal.

9. The memory device according to claim 1, further comprising:
a drive circuit, coupled to the selection switch pairs and generating the search data pairs according to source data.

10. An approximation search method for data, comprising:
receiving a plurality of search data pairs by a plurality of selection switch pairs, respectively;
coupling a plurality of memory cell string pairs to a global bit line through the selection switch pairs, respectively;
determining by each of the memory cell string pairs whether to provide current on the global bit line according to stored data of a selected memory cell pair and each of the search data pairs;
obtaining one of a plurality of search results according to the current on the global bit line and at least one reference currents respectively corresponding to at least one similarity; and
recording the search results and generating similarity information by accumulating the search results generated time-divisionally.

11. The approximation search method according to claim 10, wherein in response to each of the search data pairs matching each of the stored data of each of the memory cell string pairs, the memory cell string pairs do not generate current on the global bit line.

12. The approximation search method according to claim 10, wherein in response to each of the search data pairs not matching at least one of the stored data of each of the memory cell string pairs, the memory cell strings generate current on the global bit line.

13. The approximation search method according to claim 10, further comprising:
wherein in response to each of the search data pairs matching each of the stored data of each of the memory cell string pairs, a first register of a page buffer records a first logic value; and
wherein in response to each of the search data pairs not matching at least one of the stored data of each of the memory cell string pairs, the first register of the page buffer records a second logic value, wherein the first logic value is complementary to the second logic value.

14. The approximation search method according to claim 13, further comprising:
setting a second register by the page buffer to record the second logic value, performing logic operation on logic values recorded in the first register and the second register, and recording an operation result in a third register.

15. The approximation search method according to claim 14, further comprising:
disposing an adder in the page buffer, and using the adder to perform a cumulative operation on logic values recorded in the third register in a time interval, or perform the cumulative operation on inverted logic values recorded in the third register to generate an addition result, and generate the similarity information according to the addition result.

16. The approximation search method according to claim 14, further comprising:
disposing an adder in the page buffer, and using the adder to perform a cumulative operation on logic values recorded in the first register in a time interval, or perform the cumulative operation on inverted logic values recorded in the first register to generate an addition result, and generate the similarity information according to the addition result.

17. The approximation search method according to claim 10, further comprising:
providing a random number generator, and setting at least one of the search data pairs to be a wild card signal.

* * * * *